(12) United States Patent
Rozenblit et al.

(10) Patent No.: US 7,542,741 B2
(45) Date of Patent: Jun. 2, 2009

(54) SYSTEM AND METHOD FOR POWER MAPPING TO COMPENSATE FOR POWER AMPLIFIER GAIN CONTROL VARIATIONS

(75) Inventors: Dmitriy Rozenblit, Irvine, CA (US); Tirdad Sowlati, Irvine, CA (US); Dongsoo Koh, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 471 days.

(21) Appl. No.: 11/343,442

(22) Filed: Jan. 31, 2006

(65) Prior Publication Data

US 2007/0207749 A1 Sep. 6, 2007

(51) Int. Cl.
*H04B 1/04* (2006.01)

(52) U.S. Cl. ............... 455/127.2; 455/234.1; 455/522; 375/297; 330/129

(58) Field of Classification Search ............ 455/115.1, 455/126, 127.1, 127.2, 232.1, 243.1, 522; 375/295, 296, 297; 330/103, 127, 129, 278, 330/282

See application file for complete search history.

(56) References Cited

U.S. PATENT DOCUMENTS

| | | | | |
|---|---|---|---|---|
| 6,205,189 B1 * | 3/2001 | Ha | ............................ | 375/345 |
| 6,373,902 B1 * | 4/2002 | Park et al. | ................... | 375/296 |
| 6,784,748 B1 * | 8/2004 | Canyon et al. | ............. | 330/296 |
| 2004/0213335 A1 * | 10/2004 | Forest et al. | ................ | 375/219 |
| 2005/0104657 A1 * | 5/2005 | Snider et al. | ................ | 330/140 |

* cited by examiner

*Primary Examiner*—Nhan T Le

(57) ABSTRACT

A system for compensating gain control variations in a power amplifier comprises a power control element configured to receive a power control signal and an instantaneous envelope power reference signal, an adder configured to combine the power control signal and the instantaneous envelope power reference signal to obtain a modified power level signal, and a mapping function configured to receive the modified power level signal and configured to alter a control input to a variable gain amplifier, the variable gain amplifier controlling an adjustable input to the power amplifier.

14 Claims, 6 Drawing Sheets

SYSTEM AND METHOD FOR POWER MAPPING TO COMPENSATE FOR POWER AMPLIFIER GAIN CONTROL VARIATIONS

BACKGROUND

Radio frequency (RF) transmitters are found in many one-way and two-way communication devices, such as portable communication devices (cellular telephones), personal digital assistants (PDAs) and other communication devices. An RF transmitter must transmit using whatever communication methodology is dictated by the particular communication system within which it is operating. For example, communication methodologies typically include amplitude modulation, frequency modulation, phase modulation, or a combination of these. In a typical global system for mobile communications (GSM) communication system using narrowband TDMA technology, a GMSK modulation scheme supplies a low noise phase modulated (PM) transmit signal to a non-linear power amplifier directly from an oscillator.

In such an arrangement, a non-linear power amplifier, which is highly efficient, can be used, thus allowing efficient transmission of the phase-modulated signal and minimizing power consumption. Because the modulated signal is supplied directly from an oscillator, the need for filtering, either before or after the power amplifier, is minimized. Other transmission standards, such as that employed in IS-136, however, use a modulation scheme in which the transmitted signal is both phase modulated (PM) and amplitude modulated (AM). Standards such as these increase the data rate without increasing the bandwidth of the transmitted signal. Unfortunately, existing GSM transmitter hardware is not easily adapted to transmit a signal that includes both a PM component and an AM component. One reason for this difficulty is that in order to transmit a signal containing a PM component and an AM component, a highly linear power amplifier is required. Unfortunately, highly linear power amplifiers are very inefficient, thus consuming significantly more power than a non-linear power amplifier and drastically reducing the talk-time and standby time of the portable communication device on a battery charge.

This condition is further complicated because GSM transmitters transmit in bursts and must be able to control the ramp-up of the transmit power as well as have a high degree of control over the output power level over a wide power range. In GSM this power control is typically performed using a closed feedback loop in which a portion of the signal output from the power amplifier is compared with a reference signal and the resulting error signal is fed back to the control port of the power amplifier.

When attempting to include an AM component in a phase modulated GSM type modulation system, the power control loop will attenuate the amplitude variations present in the signal in an attempt to maintain a constant output power. In such an arrangement, the power control loop tends to cancel the AM portion of the signal.

In such systems in which transmit signals contain both PM and AM components, the output power can be controlled by applying a pre-determined control voltage to the power amplifier. Unfortunately, this requires the use of a power amplifier with a highly linear control characteristic and wide dynamic control range. In general the highly efficient power amplifiers used in GSM transmitters do not normally exhibit these properties to a sufficient degree. In non-burst transmission systems the output power may be controlled by a feedback loop having a time-constant that is very low compared to the time-constant of the amplitude variations of the modulator. Another known method to control the output power is to "pre-distort" the modulated signal in such a way that the power control loop will cancel the effect of the pre-distortion. In such a method, the amplitude information is passed through a transfer function that is the inverse of the power control loop transfer function. Unfortunately, these methods are costly, inefficient and require significant calibration time, dedicated test equipment sensors and fine control over the input power to the power amplifier.

Further, in those transmission standards in which the signal sent to a power amplifier contains both a PM and an AM component, unless the power amplifier is very linear, it may distort the combined transmission signal by causing undesirable AM to PM conversion. This conversion is detrimental to the transmit signal and can require the use of a costly and inefficient linear power amplifier.

Further still, in transmission systems in which a combined AM and PM signal is used in a closed power control loop, it is difficult to obtain the full dynamic range in the AM signal to encompass all output power levels and to obtain sufficient dynamic range to smoothly control the ramp-up and ramp-down of the output power. In a closed power control loop system, it is important to maintain a constant, or nearly constant, loop parameters. In a system in which the AM is injected onto the transmit signal via the AM power control loop, the bandwidth requirements of the power control loop (both absolute value and consistency over the power range) are quite stringent. When a non-linear power amplifier is used to improve overall system efficiency, the gain control characteristics of the power amplifier tend to vary significantly over the range of operation and with temperature change of the power amplifier. This variation of the gain control characteristics impede system performance parameters, such as loop bandwidth, modulation accuracy, loop stability, variation in the power amplifier/system turn-on threshold (which can be thought of as a lowest reliable controlled output power), and other parameters. A significant portion of the variation of the gain control characteristics is due to the gain control function of the power amplifier (PA). Compensating the gain control characteristic of the PA by predistorting the transfer function of the PA gain control element is extremely difficult because the slope of the gain control signal could be as high as 150-250 dB/volt, especially at low power levels, thereby making predistortion of the transfer function of the gain control signal impractical.

SUMMARY

A system for compensating gain control variations in a power amplifier comprises a power control element configured to receive a power control signal and an instantaneous envelope power reference signal, an adder configured to combine the power control signal and the instantaneous envelope power reference signal to obtain a modified power level signal, and a mapping function configured to receive the modified power level signal and configured to alter a control input to a variable gain amplifier, the variable gain amplifier controlling an adjustable input to the power amplifier.

Related methods of operation are also provided. Other systems, methods, features, and advantages of the invention will be or become apparent to one with skill in the art upon examination of the following figures and detailed description.

It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
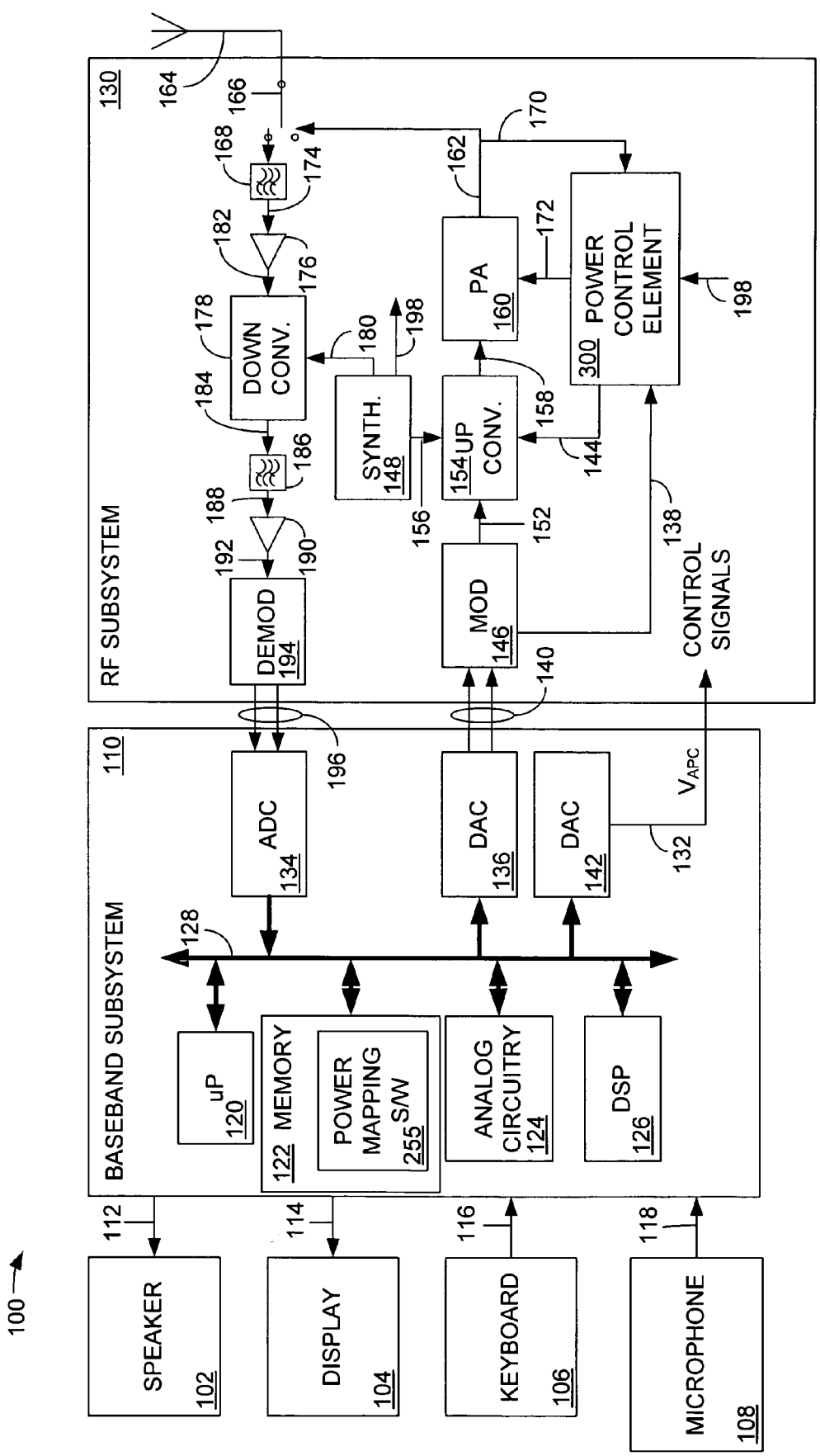
FIG. 1 is a block diagram illustrating a simplified portable transceiver.

Although described with particular reference to a portable transceiver, the system and method for power mapping to compensate power amplifier gain control variations, referred to as the system and method for power mapping, can be implemented in any system where it is desirable to transmit a combined signal including a PM component and an AM component and maintain high dynamic range control over the AM signal.

The system and method for power mapping can be implemented in hardware, software, or a combination of hardware and software. When implemented in hardware, the system and method for power mapping can be implemented using specialized hardware elements and logic. When the system and method for power mapping is implemented partially in software, the software portion can be used to precisely control the mapping function in the power control loop. The software can be stored in a memory and executed by a suitable instruction execution system (microprocessor). The hardware implementation of the system and method for power mapping can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the system and method for power mapping comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

FIG. 1 is a block diagram illustrating a simplified portable transceiver 100. The portable transceiver 100 includes speaker 102, display 104, keyboard 106, and microphone 108, all connected to baseband subsystem 110. In a particular embodiment, the portable transceiver 100 can be, for example but not limited to, a portable telecommunication device such as a mobile cellular-type telephone. Speaker 102 and display 104 receive signals from the baseband subsystem 110 via connections 112 and 114, respectively, as known to those skilled in the art. Similarly, keyboard 106 and microphone 108 supply signals to the baseband subsystem 110 via connections 116 and 118, respectively. The baseband subsystem 110 includes microprocessor (µP) 120, memory 122, analog circuitry 124, and digital signal processor (DSP) 126 in communication via bus 128. The bus 128, though shown as a single bus, may be implemented using a number of busses connected as necessary among the subsystems within baseband subsystem 110. The microprocessor 120 and the memory 122 provide the signal timing, processing and storage functions for the portable transceiver 100. If portions of the system and method for power mapping are implemented in software, then the memory 122 also includes power mapping software 255 that can be executed by the microprocessor 120, DSP 126 or by another processor.

The analog circuitry 124 provides the analog processing functions for the signals within baseband subsystem 110. The baseband subsystem 110 provides control signals to radio frequency (RF) subsystem 130 via connection 132. In one embodiment, the baseband subsystem 110 provides an automatic power control signal (supplied as an analog voltage signal and referred to as $V_{APC}$) to the RF subsystem 130. Although shown as a single connection 132, the control signals may originate from the DSP 126 from microprocessor 120, or from another element, and are supplied to a variety of points within the RF subsystem 130. It should be noted that, for simplicity, only the basic components of portable transceiver 100 are illustrated.

The baseband subsystem 110 also includes analog-to-digital converter (ADC) 134 and digital-to-analog converters (DACs) 136 and 142. The ADC 134 and DACs 136 and 142 also communicate with microprocessor 120, memory 122, analog circuitry 124 and DSP 126 via bus 128. While shown as two separate DACs 136 and 142, a single DAC may be implemented. The DAC 136 converts the digital communication information within baseband subsystem 110 into an analog signal for transmission to RF subsystem 130 via connection 140. Connection 140, while shown as two directed arrows, includes the information that is to be transmitted by RF subsystem 130 after conversion from the digital domain to the analog domain. The DAC 136 supplies baseband in-phase (I) and quadrature-phase (Q) components of the information signal to be transmitted via connection 140 to the modulator 146. In such an embodiment, modulator 146 is an I/Q modulator as known in the art. Other modulation methodologies may also be employed. The DAC 142 supplies control signals to various components with RF subsystem 130 via connection 132.

The modulator 146 modulates the I and Q information signals received from the DAC 136 onto an LO signal and provides a modulated signal via connection 152 to upconverter 154. The modulator 146 also supplies an intermediate frequency (F) signal containing only the desired amplitude modulated (AM) signal component on connection 138 for input to the power control element 300 via connection 138. In an embodiment, as will be described below, the AM signal supplied by the modulator via connection 138 can first be supplied to a reference variable gain element, and then supplied to a detector and a logarithmic amplifier associated with the RF subsystem 130,. The AM signal supplied by the modulator 146 is an intermediate frequency (IF) AM signal with a constant (average) power level that is supplied as a reference signal ($V_{REF}$) to the reference variable gain element to be described below. The power control element 300 also supplies to the upconverter 154 via connection 144 a constant level IF signal containing the phase modulated (PM) component of the transmit signal. The operation of the power control element 300 will be described below with reference to FIG. 2.

The upconverter 154 receives a frequency reference signal (referred to as a "local oscillator" or "LO" signal) from synthesizer 148 via connection 156. The synthesizer 148 determines the appropriate frequency to which the upconverter 154 will translate the modulated signal on connection 152.

The upconverter 154 supplies a phase modulated signal at the appropriate transmit frequency via connection 158 to power amplifier 160. The power amplifier 160 amplifies the phase-modulated signal on connection 158 to the appropriate power level and applies the amplitude modulation for transmission via connection 162 to antenna 164. Illustratively, switch 166 controls whether the amplified signal on connection 162 is transferred to antenna 164 or whether a received signal from antenna 164 is supplied to filter 168. The operation of switch 166 is controlled by a control signal from baseband subsystem 110 via connection 132.

A portion of the amplified transmit signal power on connection 162 is supplied via connection 170 to power control element 300. The power control element 300 forms a continuous closed power control feedback loop and supplies an information signal, referred to as $V_{PC}$, on connection 172 instructing the power amplifier 160 as to the power to which the signal on connection 158 should be amplified. The power control element 300 also receives the LO signal from synthesizer 148 via connection 198. The operation of power control element 300 will be described in further detail with respect to FIG. 2.

A signal received by antenna 164 may, at the appropriate time determined by baseband subsystem 110, be directed via switch 166 to a receive filter 168. The receive filter 168 filters the received signal and supplies the filtered signal on connection 174 to a low noise amplifier (LNA) 176. The receive filter 168 may be a bandpass filter that passes all channels of the particular cellular system where the portable transceiver 100 is operating. As an example, for a 900 MHz GSM system, receive filter 168 would pass all frequencies from 935.1 MHz to 959.9 MHz, covering all 124 contiguous channels of 200 kHz each. The purpose of the receive filter 168 is to reject all frequencies outside the desired region. An LNA 176 amplifies the very weak signal on connection 174 to a level at which downconverter 178 can translate the signal from the transmitted frequency back to a baseband frequency. Alternatively, the functionality of the LNA 176 and the downconverter 178 can be accomplished using other elements, such as, for example but not limited to, a low noise block downconverter (LNB).

The downconverter 178 receives an LO signal from synthesizer 148 via connection 180. The LO signal determines the frequency to which to downconvert the signal received from the LNA 176 via connection 182. The downconverted frequency is called the intermediate frequency (IF). The downconverter 178 sends the downconverted signal via connection 184 to a channel filter 186, also called the "IF filter." The channel filter 186 filters the downconverted signal and supplies it via connection 188 to an amplifier 190. The channel filter 186 selects the one desired channel and rejects all others. Using the GSM system as an example, only one of the 124 contiguous channels is actually to be received. After all channels are passed by the receive filter 168 and downconverted in frequency by the downconverter 178, only the one desired channel will appear precisely at the center frequency of channel filter 186. The synthesizer 148, by controlling the local oscillator frequency supplied on connection 180 to downconverter 178, determines the selected channel. The amplifier 190 amplifies the received signal and supplies the amplified signal via connection 192 to demodulator 194. The demodulator 194 recovers the transmitted analog information and supplies a signal representing this information via connection 196 to the ADC 134. The ADC 134 converts these analog signals to a digital signal at baseband frequency and transfers them via bus 128 to DSP 126 for further processing.

Figure 2:
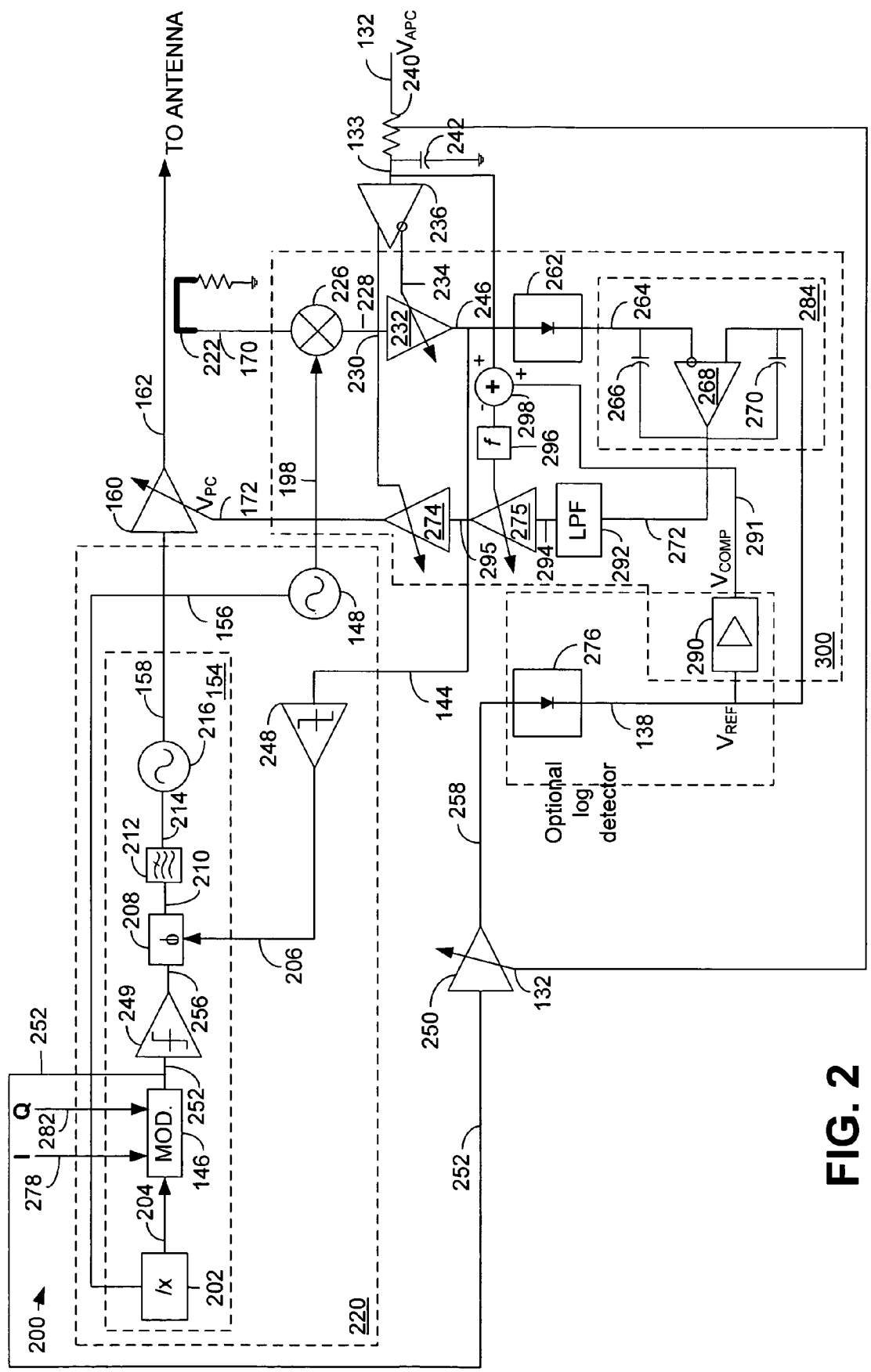
FIG. 2 is a block diagram illustrating the system and method for power mapping of the invention.

FIG. 2 is a block diagram 200 illustrating an embodiment of the system and method for power mapping. Beginning with a description of the power control loop 300, a portion of the output power present at the output of power amplifier 160 on connection 162 is diverted by a coupler 222 via connection 170 and input to a mixer 226 in the feedback path. The mixer 226 also receives the local oscillator (LO) signal from synthesizer 148 via connection 198.

The mixer 226 downconverts the RF signal on connection 170 to an intermediate frequency (IF) signal on connection 228. For example, the mixer 226 translates a signal having a frequency of approximately 2 gigahertz (GHz) on connection 170 to a frequency of approximately 100 megahertz (MHz) on connection 228 for input to the variable gain element 232. The variable gain element 232 can be, for example but not limited to, a variable gain amplifier or an attenuator. In such an arrangement, the variable gain element 232 might have a total variable gain range of approximately 70 dB. The variable gain element 232 receives a control signal input from the inverting output of amplifier 236 via connection 234. The input to amplifier 236 is supplied via connection 132 from the DAC 142 of FIG. 1. The signal on connection 132 is the reference voltage automatic power control signal, $V_{APC}$, that determines the transmit power level and provides the power profile. The $V_{APC}$ signal on connection 132 is supplied to a reconstruction filter, which includes resistor 240 and capacitor 242. In this manner, a power control signal for the transmit power level and power profile is supplied via connection 234 to the control input of the variable gain element 232.

The output of variable gain element 232 on connection 246 is at an IF and includes modulation having both an AM component and a PM component and is called the "power measurement signal." This power measurement signal is related to the absolute output power of power amplifier 160, and includes a very small error related to the AM and PM components present in the signal. The output of variable gain element 232 on connection 246 is supplied to the input of a power detector 262 and is also supplied to a limiter 248 in the phase locked loop 220, although the limiter 248 may reside outside of the PLL 220.

The IF signal on connection 246 includes both an AM component and a PM component. The IF signal on connection 246 is supplied to the power detector 262, which provides, on connection 264, a baseband signal representing the instantaneous level of IF power present on connection 246. The output of power detector 262 on connection 264 is supplied to the inverting input of amplifier 268.

The amplifier 268, capacitor 266 and capacitor 270 form a comparator 284, which provides the error signal used to control the power amplifier 160 via connection 272. The non-inverting input to the amplifier 268 is supplied via connection 138 from a reference power detector 276. The output of the modulator 146 on connection 252 is supplied to a reference variable gain element 250. The reference variable gain element 250 can be implemented as a variable gain amplifier (VGA), which is similar to the variable gain elements 232 and 274, but which has different gain characteristics. The signal supplied to the reference VGA on connection 252 comprises an IF signal containing the amplitude modulation (AM) portion of the modulated signal, which is an instantaneous envelope reference signal. The reference VGA 250 receives the $V_{APC}$ signal via connection 132 to its control input. The reference VGA 250 extends the dynamic range of the AM control signal that is supplied through the reference power detector 276 to the non-inverting input of the amplifier 268 in the comparator 284. The signal on connection 138 supplied to the non-inverting input of amplifier 268 contains the demodulated amplitude information of the AM signal developed by the modulator 146 in the phase locked loop 220.

The gain of the power control loop 300 amplifies the signal on connection 272 such that the difference between the signals on connections 264 and 138 input to amplifier 268 provide an error signal on connection 272 that is used to control the output of the power amplifier 160. In accordance with an embodiment of the invention, the output of the power detector 276 is also supplied to a logarithmic (log) amplifier 290. The log amplifier 290 converts the instantaneous envelope reference signal, $V_{REF}$, on connection 138 to the logarithmic domain on connection 291. The signal on connection 291 is referred to as a compensation signal, $V_{COMP}$. Alternatively, a logarithmic detector (not shown) can be used to take the signal on connection 258 and create the signal on connection 291. If a logarithmic detector is implemented, the power detector 276 will still be used to supply the reference signal to the power control element 300. The signal on connection 291 is supplied to an adder 298. The adder 298 combines the log reference signal, $V_{COMP}$, on connection 291 and the $V_{APC}$ signal on connection 133. The output of the adder 298 is supplied to a mapping function 296. The mapping function 296 generates a control signal that is supplied to a variable gain amplifier 275. By combining the log reference signal, $V_{COMP}$, and the $V_{APC}$ signal, gain control variations of the power amplifier 160 can be compensated by the variable gain amplifier 275 using both an average power level (the $V_{APC}$ signal) and the instantaneous envelope (the $V_{REF}$ signal, corresponding to the AM signal acted upon by the log amplifier 290). In accordance with an embodiment of the invention, the mapping function 296 takes the output of the adder 298 and alters the gain of the variable gain element 275 to compensate for gain control variations of the power amplifier 160, independent of temperature variations of the power amplifier 160.

By knowing the value of the power control signal $V_{APC}$ and the logarithmic representation of the instantaneous envelope reference signal $V_{REF}$, the transfer function of the power control loop 300 can be linearized, independent of temperature. Further, the bandwidth of the power control loop remains constant over the entire power control range.

The error signal on connection 272 is supplied to a low pass filter 292. The output of the low pass filter 292 on connection 294 is supplied to the variable gain element 275. The output of the variable gain element 275, which is a signal that compensates for the gain control variations of the power amplifier 160, is supplied to the variable gain amplifier 274, which can be similar in structure to the variable gain element 232. However, the variable gain element 274 has a gain function that is the inverse of the gain function of the variable gain element 232, since the control input to the variable gain element 274 is supplied from the non-inverting output of amplifier 236 and the control input to the variable gain element 232 is supplied from the inverting output of amplifier 236. The control input to the variable gain element 275 is controlled by the power mapping function 296 to compensate for gain variations in the control input to the power amplifier 160. In an alternative embodiment, the functions of the variable gain elements 274 and 275 can be combined into a single variable gain element. In this manner, the power amplifier control signal on connection 172 supplied to the control port of power amplifier 160 drives the power amplifier 160 to provide the proper output on connection 162, while compensating for gain control variations of the power amplifier 160.

The level of the signal on connection 264 and the level of the signal on connection 138 will be nearly equal, by the function of the negative feedback loop in the power control element 300. For example, if the gain of the variable gain element 232 is increased by a factor of 10, then the level of the output of power amplifier 160 will decrease accordingly to maintain equilibrium at the input of the amplifier 268. The output of the power amplifier 160 changes to cancel the gain change of the variable gain element 232. In this manner, the feedback amplitude signal on connection 264 remains nearly equal to the reference amplitude signal on connection 138. In this manner, a feedback signal containing an AM and a PM portion is present on connection 246. The signal on connection 246 is converted by power detector 262 from an IF signal to a baseband signal on connection 264. The difference between the signal on connection 264 and the signal on connection 138 is amplified by amplifier 268 and amplifier 274 to drive the power amplifier control port on connection 172 so that the desired signal is achieved at the output of the power amplifier 160 on connection 162. The power control loop 300 has sufficient gain so that the error signal on connection 272 can be kept small. In such a case, the gain changes of the variable gain element 232 and the power amplifier 160 will substantially be the inverse of each other.

The amplifier 268 compares the power measurement signal on connection 264 with a reference voltage signal from the reference power detector 276 on connection 138, representing the AM portion of the signal supplied by the modulator 146. The output of amplifier 268 on connection 272 is the amplitude error signal. The DC voltage level on connection 138 affects the desired static output power for the power amplifier 268, irrespective of AM modulation. The amplifier 268 compares the signal level on connection 264 with the signal level on connection 138 and then amplifies the difference, thus providing an error signal on connection 272. The comparator 284 functions as an integrator, which is also a low pass filter.

The reference VGA 250 extends the amplitude control range of the power control element 300. The reference VGA 250, which is located outside of the amplitude control loop, controls the level of the reference signal supplied to the power control element 300. The gain characteristic of the reference VGA 250 differs from the gain characteristic of the variable gain elements 232, 274 and 275. In one embodiment, the reference VGA 250 maintains a constant gain over the majority of the amplitude range of the power control element 300, including the highest output amplitude levels. However, when the output amplitude is at the low end of the range (the range of the analog power control signal $V_{APC}$), i.e., when the value of $V_{APC}$ is low, the gain of the reference VGA 250 is reduced. In this manner, the reference VGA 250 maintains closed loop amplitude control down to the lowest output power levels, and particularly, during transmit power ramp-up and transmit power ramp-down, when $V_{APC}$ is at a predetermined minimum value. The gain range of the reference VGA 250 is realized as what is referred to as a "soft step" function, and is not linear. The gain of the reference VGA 250 is shifted down by an appropriate amount (for example 15 or 18 dB) when the power control voltage $V_{APC}$ is a level sufficiently low to indicate that the transmitter (e.g., the upconverter 154 and the power amplifier 160) is in either ramp-up or ramp-down and not at a constant output power level. The dynamic range of the power detectors 262 and 276 limits the amplitude control provided by the variable gain element 232 and the variable gain element 274. The reference VGA 250 provides amplitude control at power output levels lower than the minimum power output associated with a minimum $V_{APC}$ signal level. For example, this "soft step" function can be implemented for a $V_{APC}$ signal level of approximately 0.6V when it is known that the power control characteristic of the power amplifier 160 will always generate output power levels below 0 dBm for this value of $V_{APC}$ voltage.

The power amplifier control signal on connection 172 is driven by the variable gain element 274, which corrects for the effect that variable gain element 232 and the control input to the power amplifier 160 have on the transfer function of the power control loop 300. The variable gains of variable gain element 232 and variable gain element 274 are complimentary, while the variable gain element 275 compensates for gain variations in the power amplifier 160. Because the feedback power measurement signal is present on connection 264 and the amplitude reference signal is present on connection 138, the amplifier 268 provides a dual function; (1) it amplifies the AM error signal (the difference between the signal on connection 138 and the signal on connection 264) so as to modulate the power output of power amplifier 160 via connection 172 to have the correct amount of AM; and (2) it performs the average power comparison and amplifies the result, thus providing a control signal also via connection 172 that drives the power amplifier 160 to the correct average power output. Therefore, at connection 172 both the AM error signal and the power control error signal are amplified to a level sufficient to drive the power amplifier 160 to the desired average power with the desired AM signal. In this manner, the desired AM portion of the signal is supplied to the control input 172 of power amplifier 160 and made present on the power amplifier output on connection 162. The mixer 226, variable gain element 232, power detector 262, amplifier 268 and variable gain elements 274 and 275 provide a continuous closed-loop power control feedback system to control the power output of power amplifier 160, while allowing for the introduction of the AM portion of the transmit signal via connection 138.

At all times, the continuous power-control feedback loop allows the correction of any phase shift caused by power amplifier 160. In this manner, the PLL 220 includes a feedback loop for looping back the output of power amplifier 160 to the input of phase/frequency detector 208. Any unwanted phase shift generated by the power amplifier 160 will be corrected by the PLL 220. The output of variable gain element 232 passes any phase distortion present via connection 246 to limiter 248 for correction by the PLL 220. As such, the phase of the output of power amplifier 160 is forced to follow the phase of the LO signal on connection 156.

In order to remove the AM from the output of variable gain element 232, the variable gain element 232 is connected via connection 246 and connection 144 to the input of limiter 248. The limiter 248 develops a feedback signal containing only a PM component on connection 206. The baseband I and Q information signals are supplied to the modulator 146 via connections 278 and 282, respectively. The I and Q baseband information signal interface is understood by those skilled in the art. As a result of the operation of the modulator 146, the output on connection 252 is an intermediate frequency signal including an AM component providing an AM reference signal and a PM component providing a PM reference signal. The output of modulator 146 is supplied via connection 252 to the reference VGA 250. The output of the reference VGA 250 is supplied to the reference power detector 276 to ensure that the reference power detector 276 receives a signal having constant average power, thus reducing the dynamic range requirement of the reference power detector 276 to only what is needed to cover the modulation range, which is typically less than 20 dB. The output of the reference power detector 276 is a voltage signal representing the amplitude of the desired transmit signal. In this manner, the signal provided on connection 138 is a reference signal that allows amplitude control of the power control loop 300 at power output levels over the full output power range, thus expanding the closed loop power control range of the power control loop 300 to over 65 dB.

The modulator 146 also provides the PM component of the signal on connection 252. This PM signal is then supplied to limiter 249, which outputs a signal on connection 256 containing the phase reference component of the transmit signal. The components within the phase locked loop 220 provide gain for the comparison of the PM on connection 256 and the phase feedback signal on connection 206, thus providing a phase error output of the phase detector 208 on connection 210. In this manner, a feedback signal taken from the output of variable gain element 232 on connection 246 is supplied as continuous feedback to the phase locked loop 220.

It should be noted that even when the power amplifier 160 is not operating, there will always be some small leakage through the power amplifier 160 onto connection 162. This small leakage is sufficient to provide a feedback signal through the variable gain element 232 and into the phase locked loop 220 such that the phase locked loop 220 can be locked using just the leakage output of power amplifier 160. In this manner, a single feedback loop can be used to continuously control the output power of power amplifier 160 from the time that the amplifier is off through the time when the amplifier 160 is providing full output power.

The modulator 146 receives an LO input signal from synthesizer 148 via connection 156. The LO signal is frequency divided by a number "x" in order to provide a signal having an appropriate frequency on connection 204. The number "x" is chosen so as to minimize the design complexity of the synthesizer 148 and can be, for example, but not limited to, chosen to convert the output of the synthesizer 148 to a frequency of about 100 MHz.

The output of phase/frequency detector 208 on connection 210 is a digital signal having a value of either a 0 or a 1 with a very small transition time between the two output states. This signal on connection 210 is supplied to low-pass filter 212, which integrates the signal on connection 210 and places a DC signal on connection 214 that controls the frequency of the transmit voltage control oscillator (TX VCO) 216. The output of TX VCO 216 is supplied via connection 158 directly to the power amplifier 160. In this manner, the synthesizer 148, limiter 248, modulator 146, limiter 249, divider 260, divider 202, phase/frequency detector 208, low-pass filter 212 and TX VCO 216 form a phase locked loop (PLL) 220, which is used to determine the transmit frequency on connection 158. When the PLL 220 is settled, or "locked," then the two signals entering the phase/frequency detector 208 on connections 256 and 206 have precisely the same phase and frequency, and the output of the phase/frequency detector 208 on connection 210 goes to zero. The output of the integrating low-pass filter 212 on connection 214 stabilizes, resulting in a fixed frequency out of TX VCO 216. For example, the synthesizer 148 and the mixer 226 ensure that the frequency of the signal output from the TX VCO 216 on connection 158 tracks the sum of the frequencies of the local oscillator signal supplied by synthesizer 148 and the IF frequency on connection 206.

When the phase locked loop 220 is locked, the phase of the signal on connection 256 and the phase of the signal on connection 206 will be equal. The gain in the phase locked loop 220 has to be sufficiently high to amplify the error signal on connection 206 to a level at which the phase/frequency detector 208 can make a comparison. By using the modulator 146 to impose the I and Q information signals on the signal on connection 204, and because the phase locked loop 220 will keep the phase of the TX VCO locked, the phase of the signal output from the TX VCO 216 on connection 158 will follow that of the phase imposed by the modulator 146. In this manner, the PM error signal present on connection 210 is minimized by the very high sensitivity, of the order of many MHz per volt, of the TX VCO 216.

Because the power control loop 300 is a closed loop for AM signals at connection 138, it is possible to use a non-linear, and therefore highly efficient, power amplifier 160. Furthermore, the undesirable and detrimental AM-to-PM conversion, which occurs due to the amplitude dependence of an amplifier's phase shift, is rectified by the power amplifier 160 being included within the phase locked loop 220. By separating the AM and the PM modulation and by providing closed loop control for both the AM and PM modulation, a non-linear, and therefore highly efficient power amplifier can be used.

In some applications it is desirable to allow the power amplifier 160 to output a signal containing both an AM component and a PM component, while maintaining the power amplifier 160 as a non-linear (and therefore highly efficient) power amplifier. In such a case, the output of modulator 146 will include both an AM and a PM component, with limiter 249 used to cancel the AM component present on connection 252, thereby preventing any AM-to-PM conversion in the phase/frequency detector 208.

Figure 3A:
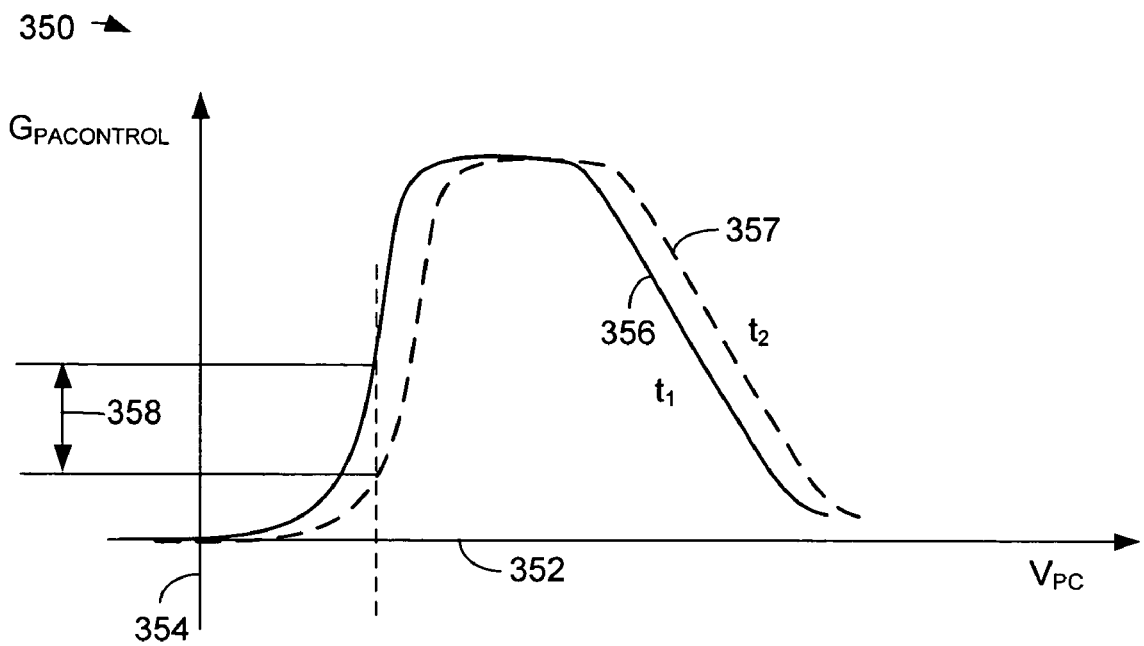
FIG. 3 is a graphical representation of the power output of power amplifier of FIG. 2 versus the voltage $V_{PC}$ applied to the control input of the power amplifier.

FIG. 3A is a graphical representation 350 of the power amplifier gain control as a function of the power amplifier control voltage $V_{PC}$. The horizontal axis 352 of the graph 350 represents the voltage $V_{PC}$ applied to the control input of the power amplifier 160 and the vertical axis 354 represents the control gain of the power amplifier 160. When the control gain of the power amplifier is $G=\Delta V_{RFOUT}/\Delta V_{PC}$, with respect to control voltage of the power amplifier, the power amplifier control gain varies substantially over temperature as illustrated using gain trace 356 at temperature $t_1$ and gain trace 357 at temperature $t_2$. For a given control voltage, $V_{PC}$, the slope of the power amplifier gain control can vary from several dB/V to approximately 150-200 dB/V over a relatively narrow voltage range, as illustrated using reference numeral 358. This variation over a relatively narrow voltage range makes it very difficult to accurately compensate the gain variation over a number of different parts and over a temperature range without the need for extensive and complicated calibration procedures.

Figure 3B:
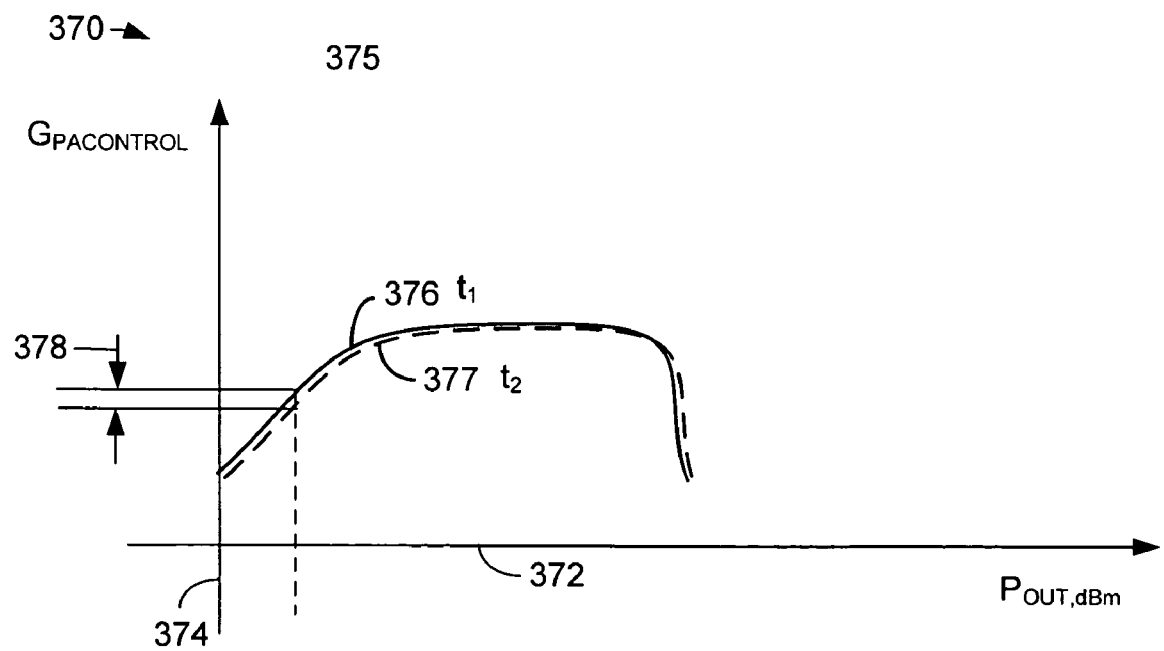

FIG. 3B is a graphical representation 370 of the power amplifier gain control as a function of the power output of the power amplifier. The horizontal axis 372 of the graph 350 represents the power output, $P_{OUT,dBm}$, of the power amplifier 160 and the vertical axis 374 represents the control gain of the power amplifier 160, $G=(\Delta V_{RFOUT}/\Delta V_{PC})$. When the control gain of the power amplifier ($G=\Delta V_{RFOUT}/\Delta V_{PC}$) is varied with respect to output power of the power amplifier, the power amplifier control gain varies substantially less over temperature than when the gain control of the power amplifier is varied as a function of the power amplifier control voltage. Furthermore, the power amplifier gain control is relatively stable over temperature and from part to part. As shown in FIG. 3B, the gain trace 376 at temperature $t_1$ and the gain trace 377 at temperature $t_2$ vary little over temperature when the gain control of the power amplifier is drawn as a function of the output power of the power amplifier, and as shown using reference numeral 378. Therefore, if the gain variation of the power amplifier is compensated as a function of the output power ($P_{OUT,dBm}$), variation from part to part and variation over temperature are significantly reduced when compared to the case when power amplifier gain compensation is performed as a function of its control input voltage ($V_{PC}$).

In this embodiment, the reference information is the output power of the power amplifier, instead of the power control signal, $V_{PC}$. Thus, the gain compensation (to maintain the same loop gain-bandwidth) is performed in the closed power control loop. In this manner, the power amplifier gain control is based on the actual power amplifier output power, and not on the power amplifier control voltage. Therefore, the power amplifier gain compensation mapping function is basically a complimentary curve of the power amplifier gain control as a function of the output power. The power amplifier output power is a combination of the detected envelope (instantaneous variations) and the operating power set by the power control signal, as shown below in FIG. 4.

Figure 4:
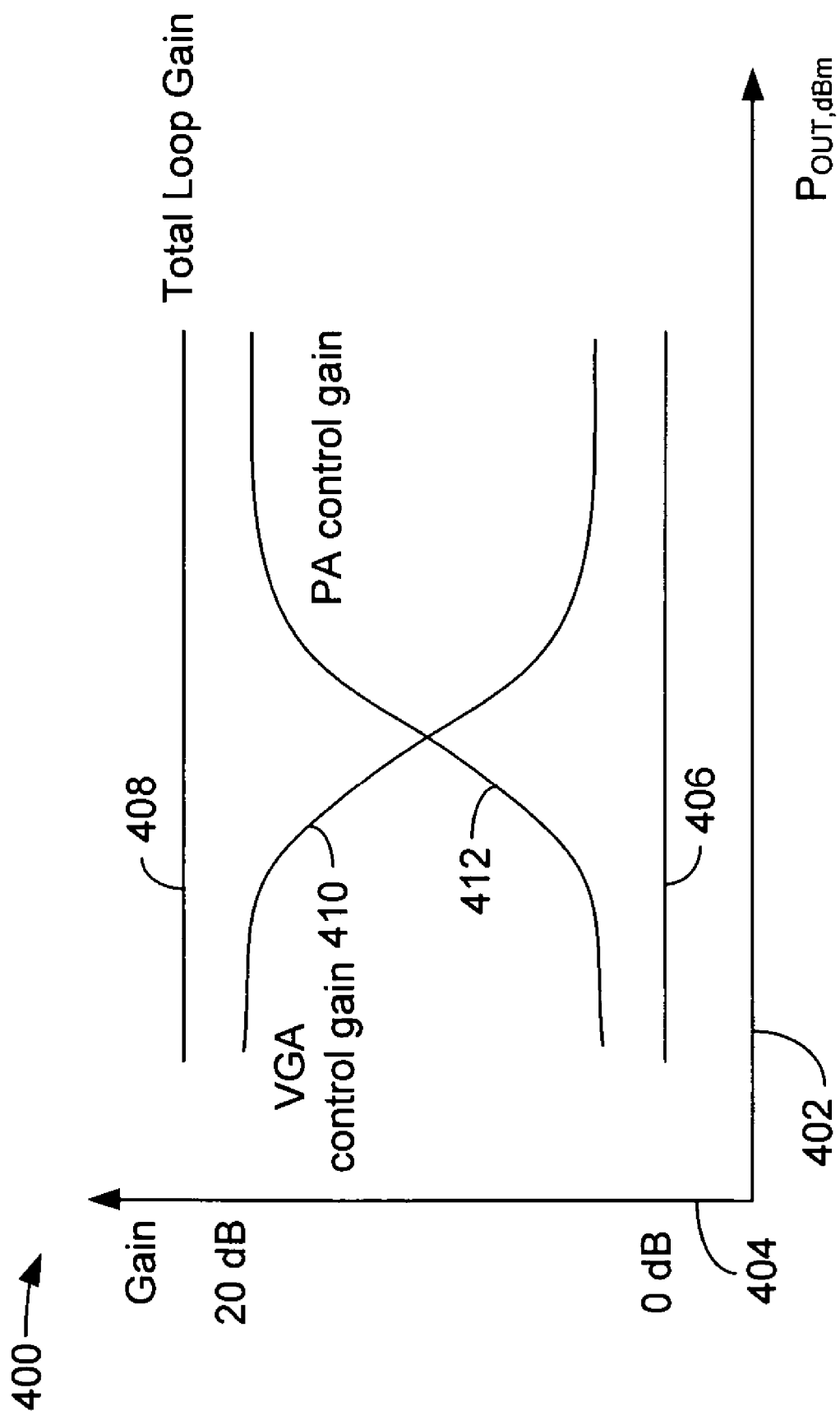
FIG. 4 is a graphical representation of the power amplifier gain control characteristic and the characteristic of the power mapping function of FIG. 2.

FIG. 4 is a graphical representation 400 of the power amplifier gain control characteristic and the characteristic of the power mapping function of FIG. 2. The horizontal axis 402 represents the output, $P_{OUT,dBm}$, of the power amplifier and the vertical axis 404 represents the value of the gain in dB. The curve 406 represents 0 dB gain and the curve 408 represents the total gain of the power control loop, in this example, 20 dB. The curve 410 represents the gain applied to the variable gain amplifier 275, as controlled by the power mapping function 296, and the curve 412 represents the control gain of the power amplifier 160. The gain applied to the variable gain amplifier 275, as controlled by the power mapping function 296, is the reciprocal function of the gain applied to the control input of the power amplifier 160. In this manner, any gain variations in the control input to the power amplifier 160 are compensated by the power mapping function 296.

Figure 5:
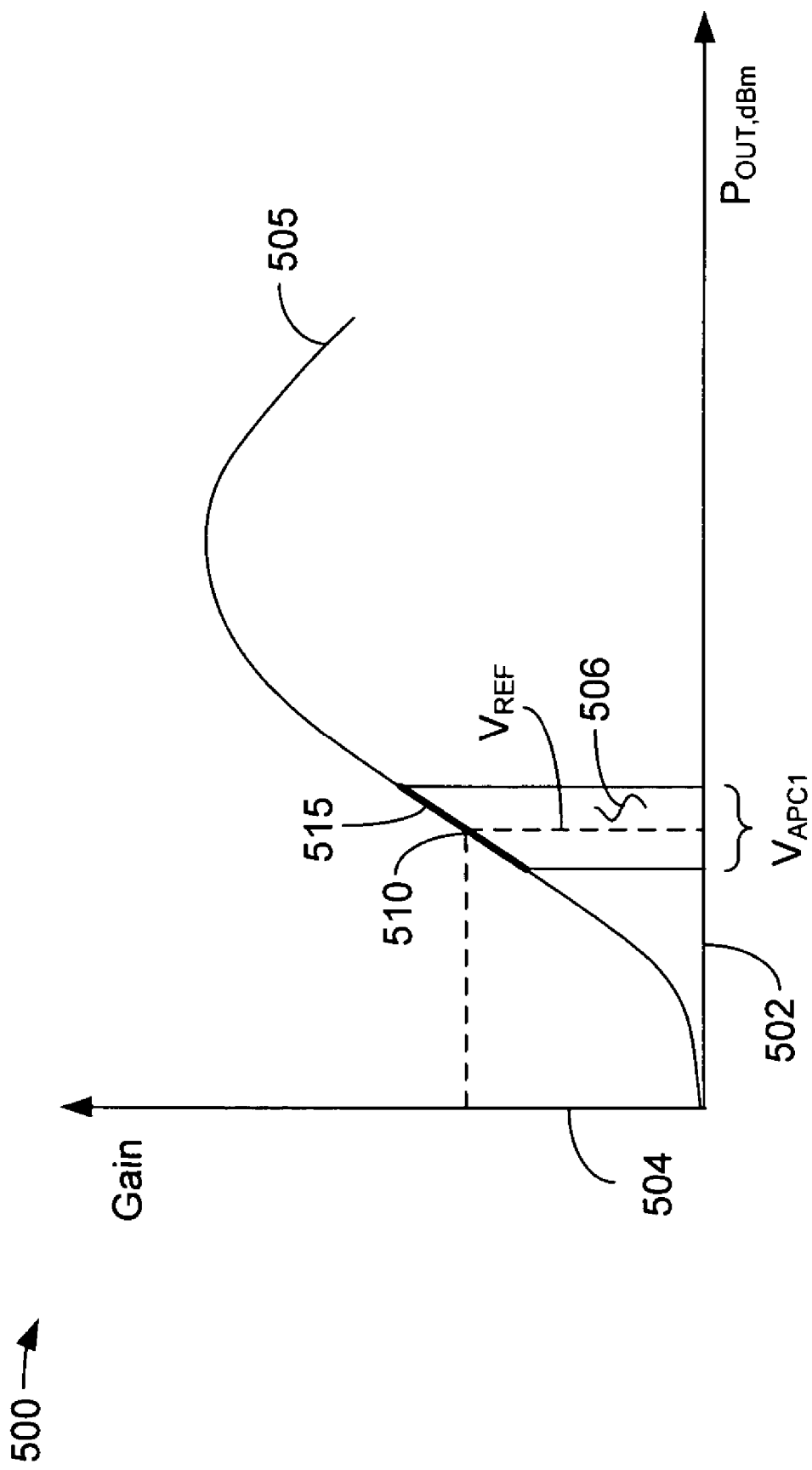
FIG. 5 is a graphical representation of the power amplifier gain versus the output, $P_{OUT,dBm}$, of the power amplifier.

FIG. 5 is a graphical representation 500 of the power amplifier gain versus the output, $P_{OUT,dBm}$, of the power amplifier. The horizontal axis 502 represents the output, $P_{OUT,dBm}$, of the power amplifier and the vertical axis 404 represents the value of the gain in dB. The curve 505 illustrates the gain of the control input of the power amplifier 160. The power control signal, $V_{APC}$, is shown as a window 506, and the instantaneous envelope reference signal, $V_{REF}$, is shown at the center of the window 506. The point 510 represents the point at which the transfer function of the power control loop exactly compensates for gain control variations in the power amplifier 160. The portion 515 of the curve 505 represents the range of compensation available for a given value of $V_{APC}$.

Figure 6:
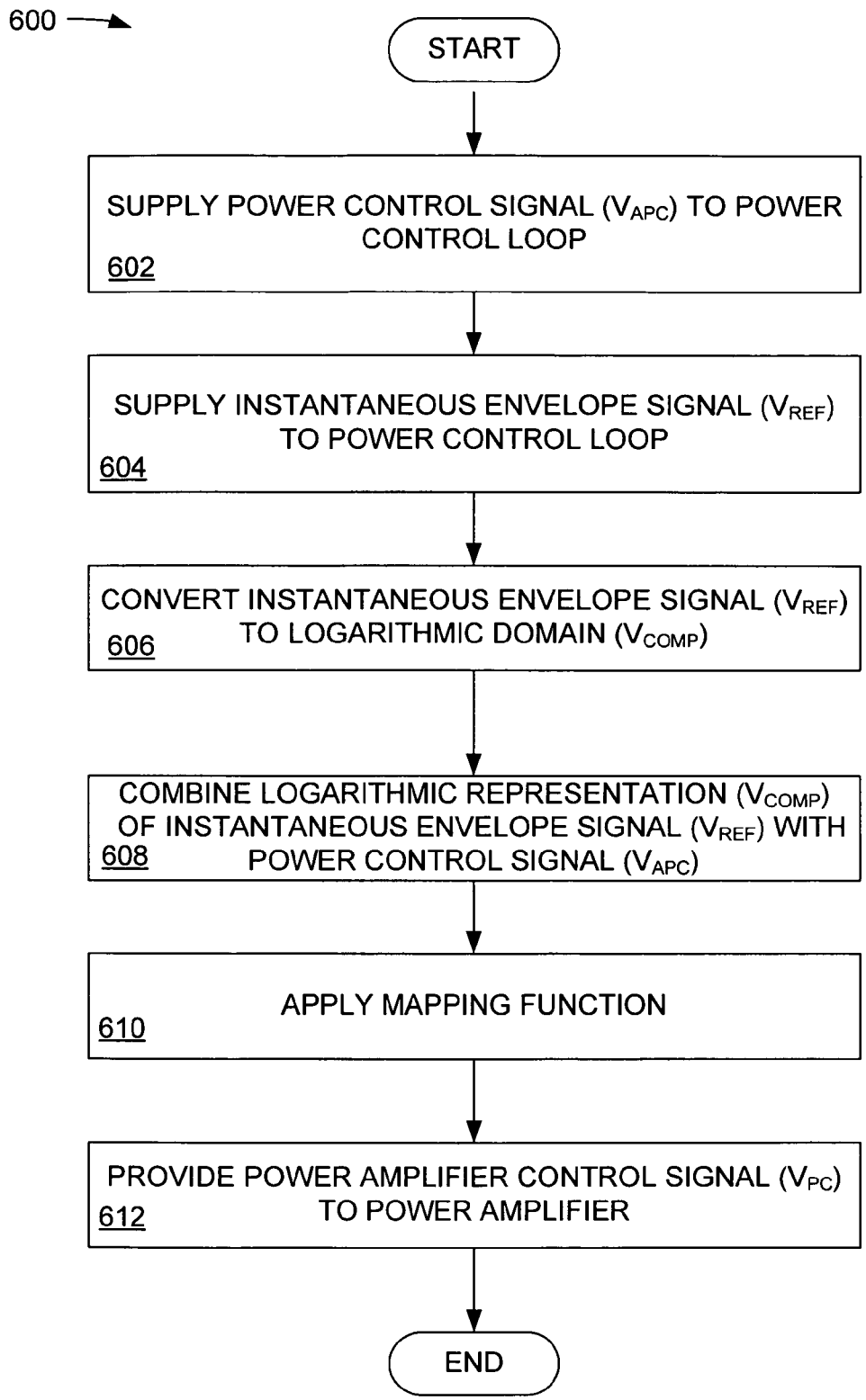
FIG. 6 is a flow chart illustrating the operation of an embodiment of the system and method for power mapping.

FIG. 6 is a flow chart 600 illustrating the operation of an embodiment of the system and method for power mapping. The blocks in the flow chart can be executed in the order shown, out of the order shown, or substantially in parallel. In block 602, the $V_{APC}$ signal is supplied the power control element 300. In block 604, an instantaneous envelope reference level signal, $V_{REF}$, is supplied to the power control element 300. In block 606, the instantaneous envelope reference level signal, $V_{REF}$, is converted to the logarithmic domain as signal $V_{COMP}$. In an alternative embodiment, a logarithmic detector can be substituted for the power detector 276 and the log amplifier 290, so that a logarithmic signal representing the instantaneous envelope reference level signal, $V_{REF}$, is available to be supplied to the power control element 300. In block 608, the logarithmic representation, $V_{COMP}$, of the instantaneous envelope reference level signal, $V_{REF}$, and the power control signal, $V_{APC}$, are combined. In block 610, a power mapping function is applied to the resultant signal. In block 612, the power amplifier control signal, VPC, is supplied to the power amplifier 160. The signal $V_{PC}$ represents a linearized control signal provided by the power control loop 300.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for compensating gain control variations in a power amplifier, comprising:
   providing a power control signal to a power control element;
   providing an instantaneous envelope power reference signal to the power control element;
   combining in the power control element the power control signal and the instantaneous envelope power reference signal to obtain a modified power level signal;
   applying the modified power level signal to a power mapping function, the power mapping function configured to linearize a response of the power control element, the power control element responsive to an output of the power amplifier and having variable gain, wherein a gain of the power control element remains constant over a range of power output from the power amplifier; and
   using the modified power level signal to alter a control input to a variable gain amplifier, the variable gain amplifier controlling an adjustable input to the power amplifier.

2. The method of claim 1, wherein the modified power level signal characterizes the desired output power of the power amplifier.

3. The method of claim 1, wherein the instantaneous envelope power reference signal includes an amplitude modulated signal component.

4. The method of claim 3, wherein the instantaneous envelope power reference signal impresses the amplitude modulated signal component on the output of the power amplifier.

5. The method of claim 1, wherein the adjustable input to the power amplifier is varied with respect to an output power of the power amplifier.

6. A system for compensating gain control variations in a power amplifier, comprising:
   a power control element configured to receive an output of the power amplifier, a power control signal and an instantaneous envelope power reference signal, the power control element having variable gain, wherein a gain of the power control element remains constant over a range of power output from the power amplifier;
   an adder configured to combine the power control signal and the instantaneous envelope power reference signal to obtain a modified power level signal; and
   a mapping function configured to receive the modified power level signal and configured to alter a control input to a variable gain amplifier, the variable gain amplifier controlling an adjustable input to the power amplifier, wherein the mapping function linearizes a response of the power control element.

7. The system of claim 6, wherein the modified power level signal characterizes the desired output power of the power amplifier.

8. The system of claim 6, wherein the instantaneous envelope power reference signal includes an amplitude modulated signal component.

9. The system of claim 8, wherein the instantaneous envelope power reference signal impresses the amplitude modulated signal component on the output of the power amplifier.

10. The system of claim 6, wherein the adjustable input to the power amplifier is varied with respect to an output power of the power amplifier.

11. A portable transceiver having a system for compensating gain control variations in a power amplifier, comprising:
    transmit and receive circuitry;
    a power control element coupled to the transmit circuitry and configured to receive an output of the power amplifier, a power control signal and an instantaneous envelope power reference signal, the power control element having variable gain, wherein a gain of the power control element remains constant over a range of power output from the power amplifier;
    an adder configured to combine the power control signal and the instantaneous envelope power reference signal to obtain a modified power level signal; and
    a mapping function configured to receive the modified power level signal and configured to alter a control input to a variable gain amplifier, the variable gain amplifier controlling an adjustable input to the power amplifier, wherein the mapping function linearizes a response of the power control element.

12. The system of claim 11, wherein the modified power level signal characterizes the desired output power of the power amplifier.

13. The system of claim 11, wherein the instantaneous envelope power reference signal includes an amplitude modulated signal component.

14. The system of claim 13, wherein the instantaneous envelope power reference signal impresses the amplitude modulated signal component on the output of the power amplifier.

* * * * *